(12) United States Patent
McMullen et al.

(10) Patent No.: US 10,194,533 B2
(45) Date of Patent: Jan. 29, 2019

(54) METHODS OF LASER TRACE POST PROCESSING AND DEPANELING OF ASSEMBLED PRINTED CIRCUIT BOARDS

(71) Applicant: SMART WAVE TECHNOLOGIES, INC., Bethesda, MD (US)

(72) Inventors: Scott Arthur McMullen, Toronto (CA); Peter Zosimadis, Toronto (CA)

(73) Assignee: SMART WAVE TECHNOLOGIES, INC., Bethesda, MD (US)

( * ) Notice: Subject to any disclaimer, the term of this patent is extended or adjusted under 35 U.S.C. 154(b) by 246 days.

(21) Appl. No.: 15/112,644

(22) PCT Filed: Jan. 20, 2015

(86) PCT No.: PCT/CA2015/050036
§ 371 (c)(1),
(2) Date: Jul. 19, 2016

(87) PCT Pub. No.: WO2015/106360
PCT Pub. Date: Jul. 23, 2015

(65) Prior Publication Data
US 2016/0338204 A1  Nov. 17, 2016

Related U.S. Application Data

(60) Provisional application No. 61/929,459, filed on Jan. 20, 2014.

(51) Int. Cl.
*B23K 26/351* (2014.01)
*B23K 26/38* (2014.01)
(Continued)

(52) U.S. Cl.
CPC ......... *H05K 3/0052* (2013.01); *B23K 26/351* (2015.10); *B23K 26/38* (2013.01);
(Continued)

(58) Field of Classification Search
CPC .... B23K 26/351; B23K 26/38; H05K 3/0052; H05K 1/0292; H05K 3/0097; H05K 1/0269
(Continued)

(56) References Cited

U.S. PATENT DOCUMENTS

| 6,734,391 B2 * | 5/2004 | Jeon ................. B28D 1/221 219/121.72 |
| 6,753,500 B2 | 6/2004 | Ye et al. |

(Continued)

FOREIGN PATENT DOCUMENTS

WO   96/35177 A1   11/1996

OTHER PUBLICATIONS

International Search Report dated Apr. 27, 2015 for International Application No. PCT/CA2015/050036 (6 pages).

*Primary Examiner* — Samuel M Heinrich
(74) *Attorney, Agent, or Firm* — McDonnell Boehnen Hulbert & Berghoff LLP

(57) ABSTRACT

A method for processing a PCBa panel to individualize the PCBa's on the PCBa panel and depanel the PCBa panel in substantially one step is described. The PCBa panel initially comprises a number of PCBa's having components and traces common to a number of different product SKUs. During processing, the PCBa panel is loaded into a machine containing a first and second laser. The first laser severs extra traces on each PCBa to individualize the PCBa's for specific SKUs and the second laser cuts the links between each PCBa, thereby depaneling the PCBa panel.

21 Claims, 4 Drawing Sheets

(51) Int. Cl.
*H05K 3/00* (2006.01)
*H05K 1/02* (2006.01)
*B23K 101/42* (2006.01)
*H05K 3/26* (2006.01)

(52) U.S. Cl.
CPC ......... *H05K 1/0269* (2013.01); *H05K 1/0292* (2013.01); *H05K 3/0097* (2013.01); *B23K 2101/42* (2018.08); *H05K 3/26* (2013.01); *H05K 2201/09936* (2013.01); *H05K 2203/081* (2013.01); *H05K 2203/108* (2013.01); *H05K 2203/171* (2013.01); *H05K 2203/175* (2013.01); *H05K 2203/178* (2013.01)

(58) Field of Classification Search
USPC ........... 219/121.67, 121.72, 121.76; 29/33 P, 29/711
See application file for complete search history.

(56) References Cited

U.S. PATENT DOCUMENTS

| | | | |
|---|---|---|---|
| 7,935,941 | B2 | 5/2011 | Bruland et al. |
| 7,943,490 | B2 | 5/2011 | Su et al. |
| 8,158,493 | B2 | 4/2012 | Shah et al. |
| 2005/0194353 | A1 | 9/2005 | Johnson et al. |
| 2006/0186096 | A1 | 8/2006 | Schramm |
| 2007/0067974 | A1* | 3/2007 | Hill ............... H05K 3/0052 29/33 P |
| 2008/0195817 | A1* | 8/2008 | Hiew ............. G06K 19/077 711/115 |
| 2008/0208384 | A1 | 8/2008 | McCarthy et al. |
| 2008/0286990 | A1 | 11/2008 | Hiew et al. |
| 2011/0017716 | A1 | 1/2011 | Rumsby |

* cited by examiner

METHODS OF LASER TRACE POST PROCESSING AND DEPANELING OF ASSEMBLED PRINTED CIRCUIT BOARDS

CROSS-REFERENCE TO RELATED APPLICATIONS

This is a U.S. national phase of international Application No. PCT/CA2015/050036, filed on Jan. 20, 2015, which claims priority to U.S. Provisional Application No. 61/929459. filed Jan. 20,2015. both of which are incorporated by reference herein in their entirety.

FIELD OF THE INVENTION

The invention relates to a method for post processing an assembled printed circuit board (PCBa) panel by individualizing the PCB and depaneling the PCBa panel using two different lasers.

BACKGROUND OF THE INVENTION

An assembled printed circuit board (PCBa) is used to mechanically support and electrically connect electronic components using conductive pathways, tracks or signal traces etched from copper sheets that are laminated onto a non-conductive substrate. A PCBa also generally includes various circuit elements such as capacitors, resistors, processors or other active devices that have been manufactured into the actual substrate of the board. Today, PCBa's are used in virtually all but the simplest commercially produced electronic devices.

When products are manufactured, specific products are generally provided with unique identifiers, commonly referred to as stock keeping units (SKUs) that are used as a means of identifying a specific product as being distinct from other products. For example, a box of widgets produced by a company may have a SKU number such as 1234 assigned to the box of widgets and/or each of the individual widgets. The SKU is used in various ways for inventory management by the company. In the case of products having PCBa's, a number of different products having different SKUs may utilize a common PCBa that has been modified to perform different functions for the different products. That is, particular features or functionalities of a PCBa may be activated or deactivated during manufacture of a specific product to provide the specific functions of the product.

This type of manufacturing design is undertaken in order to produce PCBa's faster and cheaper as altering a "generic" PCBa to become a specific PCBa for identical or related SKUs is generally cheaper than designing and manufacturing several PCBa's from scratch. That is, while it may be initially more expensive to design a PCBa that can be incorporated into different products, at a certain point in the number of products and the volume of products being manufactured and sold, this approach becomes substantially cheaper.

That is, PCBa's for similar SKUs are often manufactured using automated processes wherein generic PCBa's having common components for similar SKUs are initially manufactured. After the initial manufacturing, the PCBa is processed to individualize the PCBa for a specific SKU. These processing steps commonly include modifying wire bonding configurations, connecting jumper pins with jumpers, turning on or off dual-in-line package (DIP) switches, connecting traces with zero-ohm resistors (i.e. bridging), and/or attaching additional components.

In general, many of these steps of individualizing a PCBa to become the specific PCBa for a specific SKU are performed manually in overseas manufacturing locations and require a number of different workers for the different steps. Thus, if a generic PCBa must be modified to become a specific product, there will be a lag time between making the decision to order a specific PCBa and the time to delivery. As such, the processing of a generic PCBa to become a PCBa for a specific product can be time-consuming and expensive. As is known, any lag time can be detrimental to suppliers and businesses in getting their product to the market as quickly as possible to meet changing consumer demands.

A PCBa is often created in a larger panel that consists of many smaller individual PCBa's that will be used and individually incorporated into the final product. In this process, the larger panel is broken up into individual PCBa's or "depaneled" as a further step in the processing of the PCBa. There are various techniques typically used to depanel a PCBa panel. The techniques may include: breaking the panel by hand along a groove; using a rotary blade to cut along a pre-scoured V-groove line; using a punch to punch out a PCBa from the panel; using a depaneling router to mill a connecting tab between PCBa's; and using a saw to cut through the panel. Newer techniques include laser cutting using either a UV laser or $CO_2$ laser.

Depaneling can occur at various times during PCBa processing, depending on the product, however it is often performed in a separate location than the processing for individualizing the PCBa. As is well understood, it can be time-consuming and complicated to coordinate all the necessary post-processing steps and then transport the product overseas to the market destination.

A review of the prior art reveals several references that are directed to processing PCB panels or semiconductor substrates using laser systems. For example, U.S. Pat. No. 7,943,490 teaches a method of cutting a PCB panel using a laser; U.S. Pat. No. 8,158,493 teaches a laser system for processing PCBs using an ultrashort pulse laser system; U.S. Pat. No. 6,753,500 teaches a method and apparatus for depaneling a PCB or integrated circuit (IC) unit using a laser; US Patent Publication No. 2011/0017716 teaches a system for processing devices such as PCBs by direct-write laser ablation; U.S. Pat. No. 7,935,941 teaches a method for selectively cutting links on a semiconductor substrate using a plurality of laser beams; US Patent Publication No. 2006/0186096 teaches a method of marking semiconductor wafers using a laser; and US Patent Publication No. 2005/0194353 teaches a process for forming traces on a PCB using laser etching.

In view of the foregoing, there is a need for a technology that reduces the time, expense, logistical complications and labor required for PCBa post-processing, as well as reducing the board size of a PCBa. There is also a need for a technology that decreases the lag time from designing a PCBa for a specific SKU and getting the product to the market.

SUMMARY OF THE INVENTION

In accordance with the invention, there are provided methods for processing PCBa panels. More specifically, there is provided a method for processing a PCBa panel comprising the steps of a) loading at least one PCBa panel containing a plurality of connected PCBa's into a processing device having a first and second laser, wherein each PCBa has a plurality of traces; b) severing at least one trace on each PCBa using the first laser to individualize the PCBa's; and c) depaneling the PCBa panel to separate the plurality of connected PCBa's using the second laser.

In one embodiment, in step a), each PCBa comprises components and traces that are common to a plurality of product stock keeping units (SKUs), and in step b) each PCBa is individualized for one product SKU.

In another embodiment, the first laser has a wavelength of 1200 nm or less. The first laser may be a fiber laser or an ultraviolet (UV) laser. In one embodiment, the second laser has a wavelength of 11 µM or less. The second laser may be a carbon dioxide laser.

In yet another embodiment, during step b), compressed air is blown onto the PCBa to minimize debris on the PCBa.

In a further embodiment, before or after step b), the first laser is used to visually mark PCBa's. The second laser may be used to modify the shapes of the PCBa's.

In one embodiment, the PCBa panel is manufactured at a first location and steps a) to c) are performed at a second location. The first location may be an offshore location and the second location may be an onshore location.

In a further embodiment, step b) of the method takes less than 1 second per PCBa. In one embodiment, step b) takes approximately 0.5 seconds per PCBa. In another embodiment, step c) takes less than 0.5 seconds per PCBa. In yet a further embodiment, there is virtually no time lag between steps b) and c).

In another form of the invention, there is provided the use of a machine having first and second lasers individually controllable on at least an X and Y axis wherein the first laser is operated to individualize a panel of generic PCBa's into a panel of PCBa's having individual stock keeping units (SKUs), and the second laser is operated to depanel the PCB panel. In one embodiment, there is virtually no time lag between individualizing the PCBa's into SKUs and depaneling the PCB panel.

BRIEF DESCRIPTION OF THE DRAWINGS

The invention is described with reference to the accompanying figures in which.

DETAILED DESCRIPTION OF THE INVENTION

Figure 1:
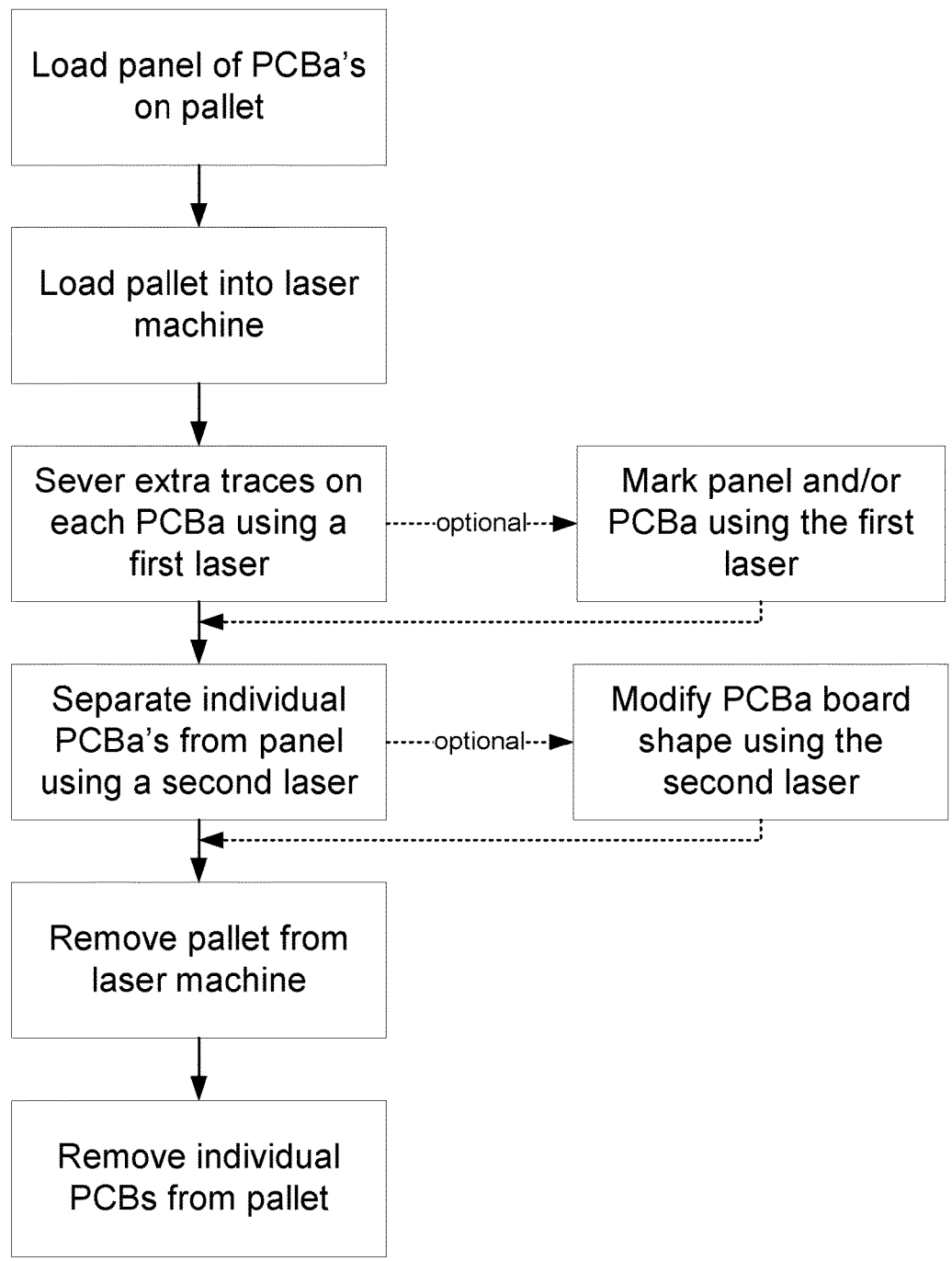
FIG. 1 is flowchart of a process for individualizing and depaneling a PCBa panel in accordance with one embodiment of the invention.
Figure 2:
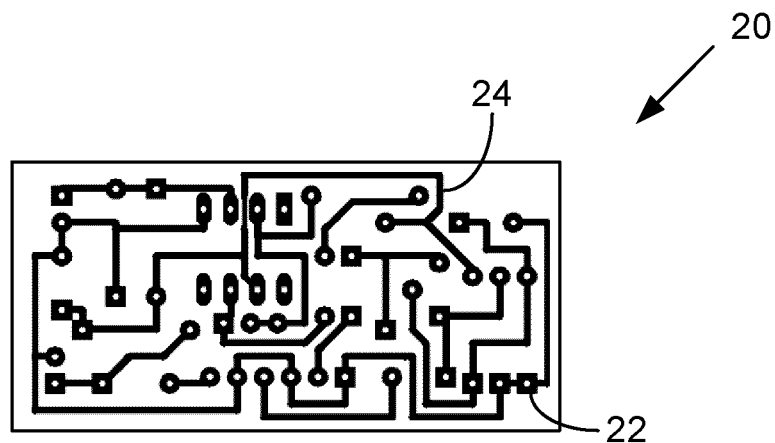
FIG. 2 is a top view of a typical PCBa that is processed in accordance with one embodiment of the invention.

With reference to FIG. 1, a process for individualizing PCBa's for specific SKUs and depaneling a PCBa panel into individual PCBa's in substantially one step using a single machine is described. The process is designed to efficiently and effectively process a PCBa panel in order to individualize each PCBa and depanel the panel. A typical and individual PCBa 20 is shown in FIG. 2, wherein the PCBa contains a number of electrical components 22 such as various capacitors, resistors, microprocessors, etc., as well as a number of signal traces 24. In the context of the invention, the PCBa 20 can potentially be integrated into a number of different products having different functionalities wherein prior to assembly into a specific product, the PCBa's functionality is altered to be product specific. In other words, various components of the PCBa are common to a number of different SKUs such that the PCBa includes extra signal traces that link the components that until severed, do not allow the PCBa to be used in different products. However, by severing various signal traces, the PCBa can be modified to form a number of different SKUs. For example, the PCBa may initially contain components and traces that once modified could be used in over 30 different SKUs. Having extra signal traces on the PCBa does not require significant additional board space, nor does it necessarily require the PCBa to include extra components, other than the extra traces which generally do not add to the cost of manufacturing the PCBa panel.

Figure 3:
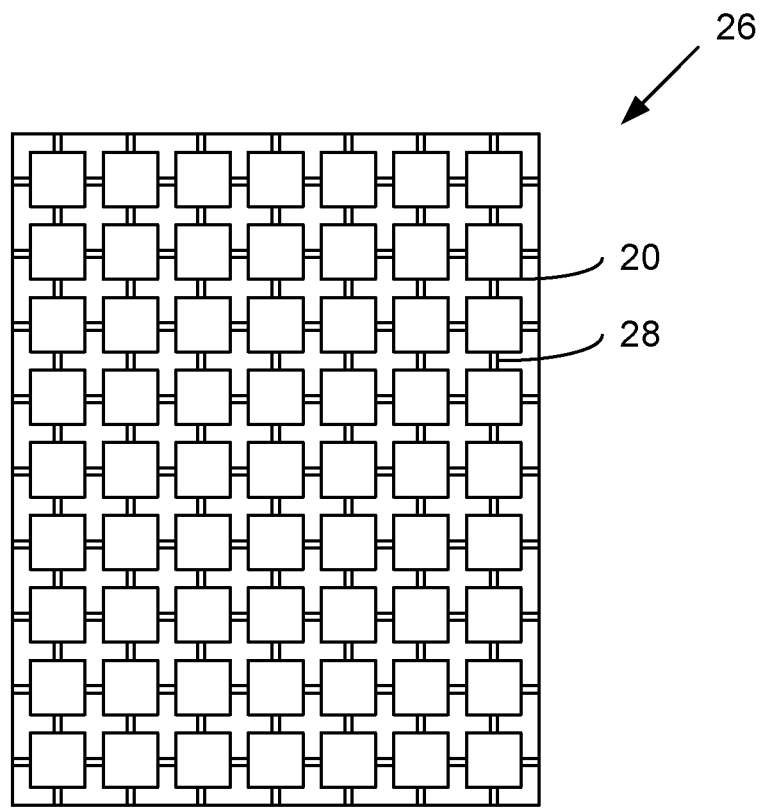
FIG. 3 is a top view of a typical PCBa panel that is processed in accordance with one embodiment of the invention.

When the PCBa's are manufactured, they are formed into a panel 26, as shown in FIG. 3, wherein an array of PCBa's 20 are connected by tabs 28. FIG. 3 illustrates a 7 by 9 grid of PCBa's, however as understood by those skilled in the art, any number of PCBa's can be formed into a panel.

Figure 4:
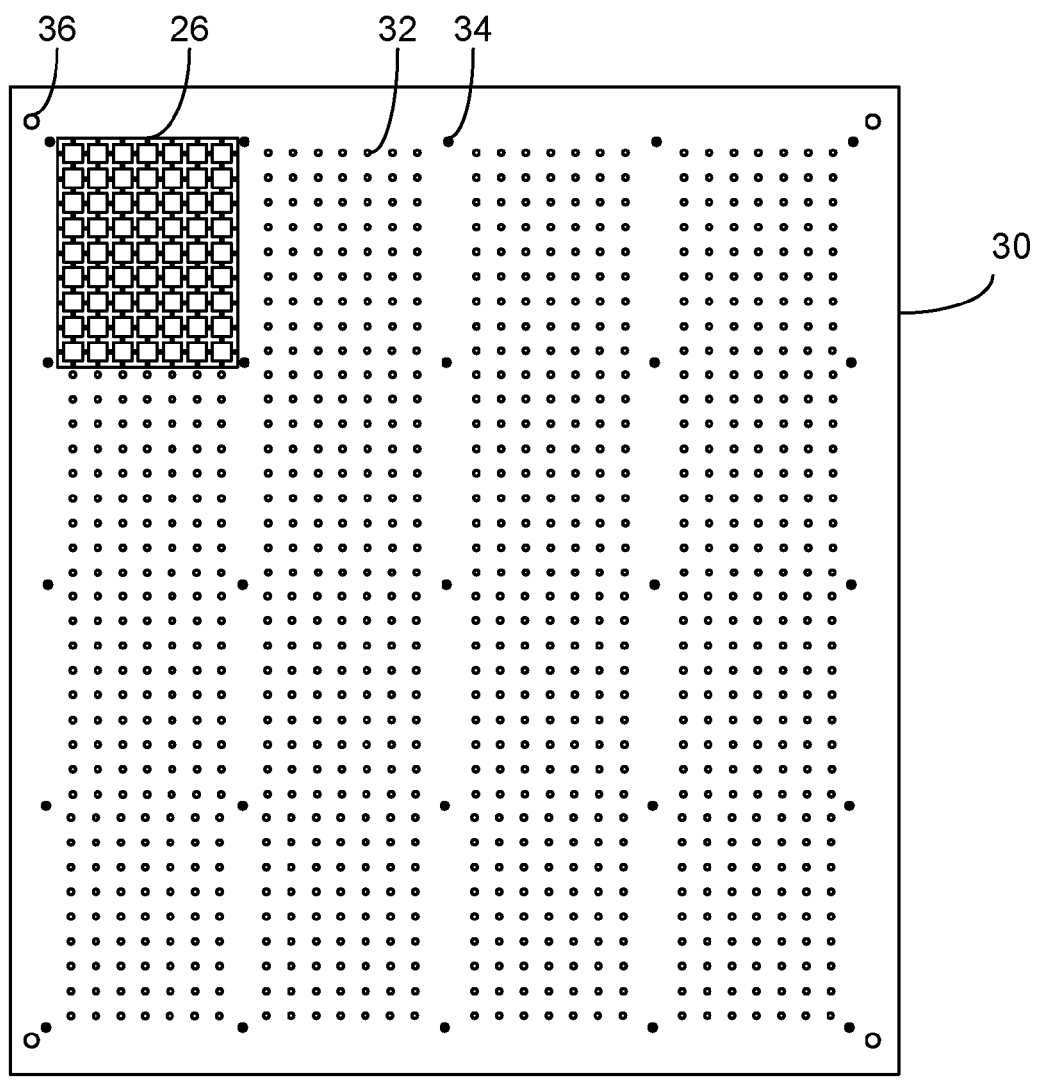
FIG. 4 is a top view of a typical pallet containing one PCBa panel for processing in accordance with one embodiment of the invention.
Figure 5:
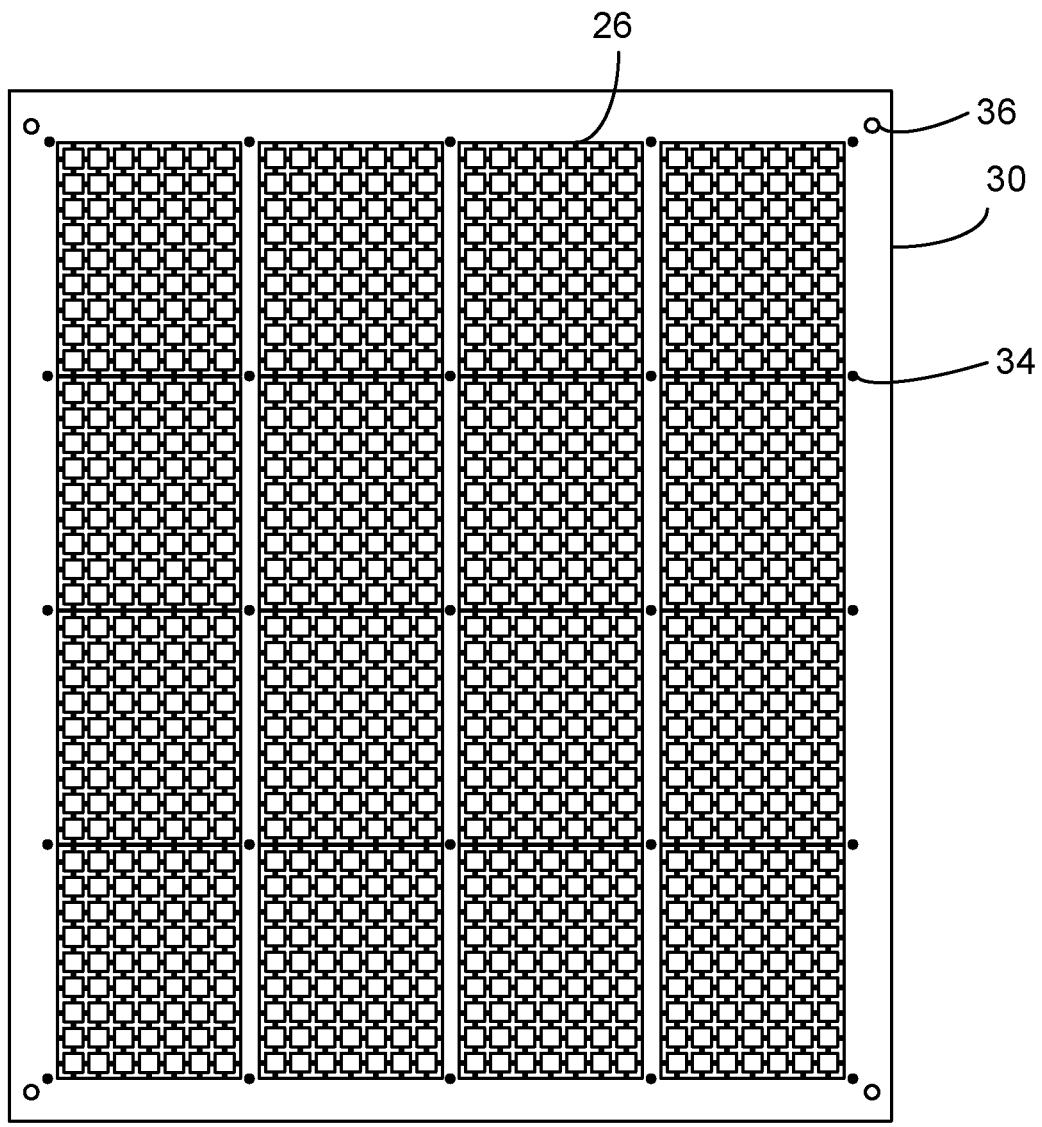
FIG. 5 is a top view of a typical pallet containing a plurality of PCBa panels for processing in accordance with one embodiment of the invention.

In the process of the invention, a pallet is loaded with at least one PCBa panel containing a number of individual PCBa's. As shown, the pallet may hold a number of PCBa panels 26, in this case a 4 by 4 array of PCBa panels. FIG. 4 illustrates a typical pallet 30 containing one PCBa panel 26. The pallet preferably contains a plurality of holes 32 into which an alignment peg on the underside of each PCBa is inserted in order to align and hold the PCBa panel in place on the pallet during processing. FIG. 5 illustrates a fully loaded pallet 30 containing 16 PCBa panels 26. As understood by those skilled in the art, the pallet can be designed to hold any number of PCBa panels.

Next, the pallet containing the panels is loaded into and secured within a processing machine (not shown) for processing. The pallet may be fully loaded with panels, however this is not necessary as few as one panel can be processed at one time. The pallet may contain an aperture 36 in each corner of the pallet through which a dowel (not shown) can be inserted to secure the pallet to a support in the processing machine. As would be known to one skilled in the art, other securing means for the pallet and for the panels on the pallet could be used.

The processing machine contains a first and second laser for processing the PCBa panels each moveable on at least an X and Y axis so as be positionable at and above a PCBa 20. Once the pallet is secured in the machine, the first laser is used to sever extra traces on each PCBa to individualize the PCBa's for specific SKUs. That is, the first laser can precisely and selectively remove extra traces on the PCBa. The pallet may contain posts 34 between the panels 26 and may be used as reference points for orienting the lasers with respect to the panels during processing. Other orienting means as would be known to one skilled in the art could be used.

Next, the second laser in the machine is used to cut the links between each PCBa to depanel the PCBa panel. The second laser can effectively and efficiently cut through the tabs 28 in the panel to separate the PCBa's without damaging them. After depaneling, the pallet is removed from the machine, and the individual PCBa's are removed for use in an end product.

Preferably, the first laser is a fiber laser in which the active gain medium is an optical fiber doped with rare-earth elements such as erbium, ytterbium, neodymium, dysprosium, praseodymium, and thulium. The fiber laser emits brief bursts of highly concentrated and carefully controlled light to precisely and selectively remove extra trace material on the PCBa, such as copper and other metals that are typically used to form traces. In this embodiment, the first laser preferably has a power capacity of approximately 20 to 40 W and emits a wavelength of approximately 900 to 1200 nm with a pulse frequency from 20 to 80 khz.

Preferably, the second laser is a carbon dioxide ($CO_2$) laser wherein the active gain medium is a gas discharge. The $CO_2$ laser emits a high-power continuous wave that can efficiently cut through the tabs. In this embodiment, the $CO_2$ laser preferably has a power capacity of approximately 50 to 70 W with a wavelength of approximately 10 to 11 μM in order to effectively depanel the PCBa panel into individual PCBa's 20.

Although the preferred embodiments use a fiber laser as the first laser and a $CO_2$ laser as the second laser, various types of lasers having various laser mediums, power capacities, wavelengths and/or pulse frequencies could be used to effectively sever traces in the PCBa's and depanel the PCBa panel, as would be known to a person of ordinary skill in the art.

In an alternate embodiment, the first laser is an ultraviolet (UV) laser. The UV laser may have a wavelength between approximately 400 nm to 10 nm.

In a further embodiment, while the first laser is severing traces on the PCBa panel, compressed air is directed at the area of the PCBa panel being processed. The compressed air keeps the processing area free from contaminants and cuttings, thereby increasing the efficacy and precision of the trace cutting, reducing residual conductance on the PCBa panel and improving the processing capability of the PCBa panel.

In another embodiment, extra steps may be taken while the pallet is in the machine. Specifically, the first laser may be used to visually mark the PCBa panel or each individual PCBa. This may be done before or after the PCBa traces are severed and may be done for distinguishing specific SKUs. The shape of the PCBa board may also be modified using the second laser during depaneling, in order to remove any extra material and/or shape the PCBa for a better fit in the end product if necessary.

In a further embodiment, both the first and second laser are active at the same time to conduct work simultaneously on different panels in the processing machine. That is, each laser may be independently moveable within the processing machine.

Importantly, the process enables the individualization and depaneling of PCBa panels to be combined into one automated process using one machine. A relatively generic PCBa panel containing components for a number of SKUs can quickly and easily be turned into individual PCBa's for a specific SKU as needed. The entire process only takes a matter of minutes and can be easily performed near an end product's final destination market. Importantly, this allows for PCBa panels to be processed using a "just-in-time" (JIT) manufacturing model, wherein products are created to meet demand, instead of being created in surplus or in advance of demand. This allows for consumer needs to be quickly and effectively responded to with little delay. It also minimizes overproduction and excess inventory, and the associated carrying costs.

By way of example, a manufacturer may have a range of products for dispensing different materials such as soap, paper towels, hand sanitizer etc. Each dispenser may have moderately different functionality where for example, the dispenser would execute a slightly different sequence of steps to dispense a specific product. As a more specific example, the manufacturer may have two different soap dispensers for commercial vs. a residential application and where, based on the properties of the product being dispensed, may require a slightly different dispensing cycle. As a result, each dispenser would have a different SKU and the PCBa that is incorporated into each dispenser being different to accommodate the different dispensing protocol.

A PCBa can be designed for both the residential and commercial dispenser SKUs, wherein the removal of one trace could enable the PCBa to be used in the residential dispenser, while the removal of a different trace allows the PCBa to be used in the commercial dispenser. Similarly, the PCBa can be designed with greater complexity such that the removal of various traces could enable the PCBa to be used in a significantly larger number of products, potentially up to about 30 different products for example.

In the example given where the PCBa is usable in two products, the final assembly of the product and the delivery of the product to the local market is performed onshore, while the generic PCBa panel is manufactured overseas. In an overseas manufacturing facility, the generic PCBa panel is typically produced on an assembly line having multiple stations that do not enable SKU differentiation during the course of manufacture. After the generic PCB panel is produced, the panel may be further batch processed into specific SKUs using a different manufacturing line and a number of steps. This processing may be done automatically or manually, and may be performed at the same manufacturing facility that created the generic PCBa panel or a different overseas manufacturing facility.

After the specific SKUs are created, the PCBa panel is depaneled. Often depaneling is performed at a different manufacturing facility than where the generic PCBa panel is created, and this may be done at an overseas manufacturing facility or onshore where the final product is assembled for delivery.

From the onshore manufacturer's perspective, there will likely be a significant time delay from the time the onshore manufacturer makes an order for a specific SKU since the offshore manufacturer will have to set-up the line to create the individual SKUs, execute the order and then deliver the order to the onshore manufacturer.

In particular, in the event that onshore market conditions require the prompt delivery of a particular SKU, the time delay for the offshore manufacturer to deliver the SKU may be significant and thereby detrimental to the onshore manufacturer. Typically, an offshore manufacturer may require 6-8 weeks lead time to manufacture the PCBa's for a specific SKU, plus approximately 4 weeks for shipping to the onshore market.

The invention enables the onshore manufacturer to overcome this manufacturing bottleneck. That is, by having a supply of generic PCBa's onshore and executing the combined trace severing and depaneling process in an onshore facility, the onshore manufacturer can affect more rapid and more efficient manufacturing of a particular product, and for any quantity required. This is contrasted with the current process where the onshore manufacturer must either pre-order an anticipated number of SKU specific PCBa's from the offshore manufacturer and/or be subjected to time delays in receiving product specific SKUs from the offshore manufacturer.

An exemplary embodiment of the invention is provided with respect to the time required for processing a plurality of PCBa's.

TABLE 1

Approximate time required for individualizing and depaneling a plurality of PCBa's in accordance with one embodiment of the invention.

| Step | Approximate Time Required |
|---|---|
| 1) Load the 32 PCBa panels onto a pallet, containing a total of 2464 PCBa's, either manually or automatically. | 6 minutes |
| 2) Load the pallet into the machine, either manually or automatically. | 1 minute |
| 3) Sever the traces on each PCBa. | Variable depending on the SKU. Averages approximately 0.5 s/PCBa. Approximately 20.5 minutes for 2464 PCBa's. |
| 4) Depanel the PCBa panel. | Approximately 0.3 s/PCBa. Apporximately 12.3 minutes for 2464 PCBa's. |

In the above example, it takes approximately 40 minutes to individualize and depanel 32 PCBa panels containing 2464 PCBa's. In contrast, using a manual process that is performed at an offshore location typically requires a 6-8 week lead time plus 4 weeks for shipping the PCBa's.

Although the present invention has been described and illustrated with respect to preferred embodiments and preferred uses thereof, it is not to be so limited since modifications and changes can be made therein which are within the full, intended scope of the invention as understood by those skilled in the art.

The invention claimed is:

1. A method for processing an assembled printed circuit board (PCBa) panel comprising the steps of:
    a) loading at least one PCBa panel containing a plurality of connected PCBa's into a processing device having a first and second laser, wherein each PCBa has a plurality of traces;
    b) severing at least one trace on each PCBa using the first laser to individualize the PCBa's; and
    c) depaneling the PCBa panel to separate the plurality of connected PCBa's using the second laser.

2. The method of claim 1 wherein in step a), each PCBa comprises components and traces that are common to a plurality of product stock keeping units (SKUs), and in step b) each PCBa is individualized for one product SKU.

3. The method of claim 1 wherein the first laser has a wavelength of 1200 nm or less.

4. The method of claim 1 wherein the first laser is a fiber laser.

5. The method of claim 1 wherein the first laser is an ultraviolet (UV) laser.

6. The method of claim 1 wherein the second laser has a wavelength of 11 µM or less.

7. The method of claim 1 wherein the second laser is a carbon dioxide laser.

8. The method of claim 1 wherein during step b), compressed air is blown onto the PCBa to minimize debris on the PCBa.

9. The method of claim 1 wherein before or after step b), the first laser is used to visually mark PCBa's.

10. The method of claim 1 wherein the second laser is used to modify the shapes of the PCBa's.

11. The method of claim 1 wherein the PCBa panel is manufactured at a first location and steps a) to c) are performed at a second location.

12. The method of claim 11 wherein the first location is an offshore location and the second location is an onshore location.

13. The method of claim 1 wherein step b) takes less than 1 second per PCBa.

14. The method of claim 13 wherein step b) takes approximately 0.5 seconds per PCBa.

15. The method of claim 1 wherein step c) takes less than 0.5 seconds per PCBa.

16. The method of claim 1 wherein there is virtually no time lag between steps b) and c).

17. The use of a machine having first and second lasers individually controllable on at least an X and Y axis wherein the first laser is operated to individualize a panel of generic PCBa's into a panel of PCBa's having individual stock keeping units (SKUs), and the second laser is operated to depanel the PCB panel.

18. The use as in claim 17 wherein there is virtually no time lag between individualizing the PCBa's into SKUs and depaneling the PCB panel.

19. A method for processing an assembled printed circuit board (PCBa) panel comprising the steps of:
    a) loading at least one PCBa panel on a pallet containing a plurality of connected PCBa's into a processing device having a first and second laser each independently movable on an X and Y axis, wherein each PCBa has a plurality of traces and where each PCBa comprises components and traces that are common to a plurality of product stock keeping units (SKUs);
    b) severing at least one trace on each PCBa using the first laser to individualize the PCBa's for one product SKU; and
    c) depaneling the PCBa panel over the pallet to separate the plurality of connected PCBa's using the second laser.

20. The method of claim 19 wherein the first laser is an ultraviolet (UV) laser having a power capacity of 20 to 40 W, a wavelength of 900 to 1200 nm and a pulse frequency from 20 to 80 khz and the second laser is a carbon dioxide laser having a power capacity of 50 to 70 W and a wavelength of 10 to 11 µM.

21. The method of claim 20 further comprising the step of prior to step a) shipping the PCBa panel from a first offshore location to a second onshore location.

* * * * *